United States Patent [19]

Lockhart, Jr.

[11] 4,249,173
[45] Feb. 3, 1981

[54] LOGIC SIGNALS CONTROL SYSTEM

[75] Inventor: James A. Lockhart, Jr., Basking Ridge, N.J.

[73] Assignee: Burroughs Corporation, Detroit, Mich.

[21] Appl. No.: 75,588

[22] Filed: Sep. 14, 1979

[51] Int. Cl.³ .............................................. G08B 5/36
[52] U.S. Cl. ................................. 340/731; 324/73 R; 340/799
[58] Field of Search ......... 340/731; 324/73 R, 73 AT

[56] References Cited

U.S. PATENT DOCUMENTS

| 3,938,130 | 2/1976 | Burnham et al. | 340/731 X |
| 4,090,188 | 5/1978 | Suga | 340/731 |
| 4,192,451 | 3/1980 | Swerling et al. | 324/73 R |

Primary Examiner—David L. Trafton
Attorney, Agent, or Firm—Kevin R. Peterson; Robert A. Green; David G. Rasmussen

[57] ABSTRACT

The disclosure is of a system including a counter for generating a sequence of logic signals forming a truth table on its output lines. Some of the lines are coupled directly to a memory or buffer and then to a utilization means. Others are coupled through a controllable multiplexer to the memory so that overall, as the counter counts, a desired logic sequence or truth table appears on all of the lines feeding into the memory.

The multiplexer can be operated so that several different sizes of matrices can be scanned by suitably setting the controllable multiplexer, and one use of the invention is for scanning and testing memories of various sizes.

7 Claims, 12 Drawing Figures

| MATRIX 4K (64x64) | R0 | R1 | R2 | R3 | R4 | R5 | R6 | R7 | R8 | C0 | C1 | C2 | C3 | C4 | C5 | C6 | C7 | C8 |
|---|---|---|---|---|---|---|---|---|---|---|---|---|---|---|---|---|---|---|
| ROW 1 - COL 1 | o | o | o | o | o | o | – | – | – | o | o | o | o | o | o | – | – | – |
| ROW 2 - COL 1 | – | o | o | o | o | o | – | – | – | o | o | o | o | o | o | – | – | – |
| ROW 3 - COL 1 | o | – | o | o | o | o | – | – | – | o | o | o | o | o | o | – | – | – |
| ROW 1 - COL 2 | o | o | o | o | o | o | – | – | – | – | o | o | o | o | o | – | – | – |
| ROW 2 - COL 2 | – | o | o | o | o | o | – | – | – | – | o | o | o | o | o | – | – | – |
| ROW 3 - COL 2 | o | – | o | o | o | o | – | – | – | – | o | o | o | o | o | – | – | – |
| 16 K (128 X 128) | | | | | | | | | | | | | | | | | | |
| ROW 1 - COL 1 | o | o | o | o | o | o | o | – | – | o | o | o | o | o | o | o | – | – |
| 64 K (256 X 256) | | | | | | | | | | | | | | | | | | |
| ROW 1 - COL 1 | o | o | o | o | o | o | o | o | – | o | o | o | o | o | o | o | o | – |
| 256 K (512 X 512) | | | | | | | | | | | | | | | | | | |
| ROW 1 - COL 1 | o | o | o | o | o | o | o | o | o | o | o | o | o | o | o | o | o | o |

LINES

Fig. 12

LOGIC SIGNALS CONTROL SYSTEM

BACKGROUND OF THE INVENTION

At the present time, the electronics industry uses large numbers of 4K and 16K rams, and there is a need to test and evaluate these devices. There are large computer-controlled testers for testing and evaluating such semiconductor devices, but there are no relatively simple and inexpensive testers of the type which might be used in a laboratory to provide quick and easy analysis of memories of different sizes.

The present invention solves this problem by means of a relatively simple system which can be used to test 4K, 16K, 64K, or 256K rams by merely operating a switching mechanism.

DESCRIPTION OF THE DRAWINGS

FIG. 12 shows the logic signals present at different stages in the operation of the system of the invention.

DESCRIPTION OF THE PREFERRED EMBODIMENTS

Figure 1:
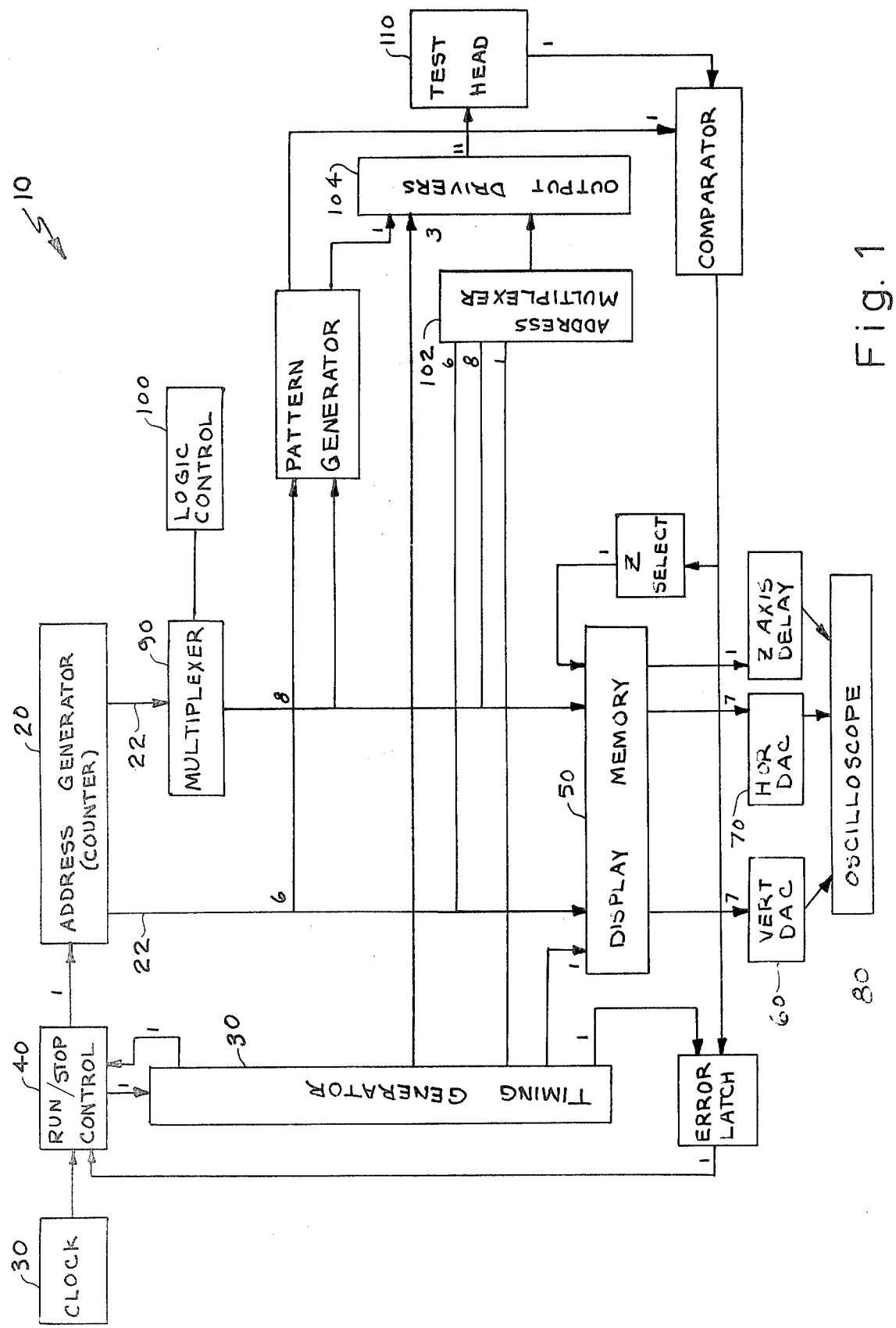
FIG. 1 is a block diagram of the system of the invention.
Figure 2:
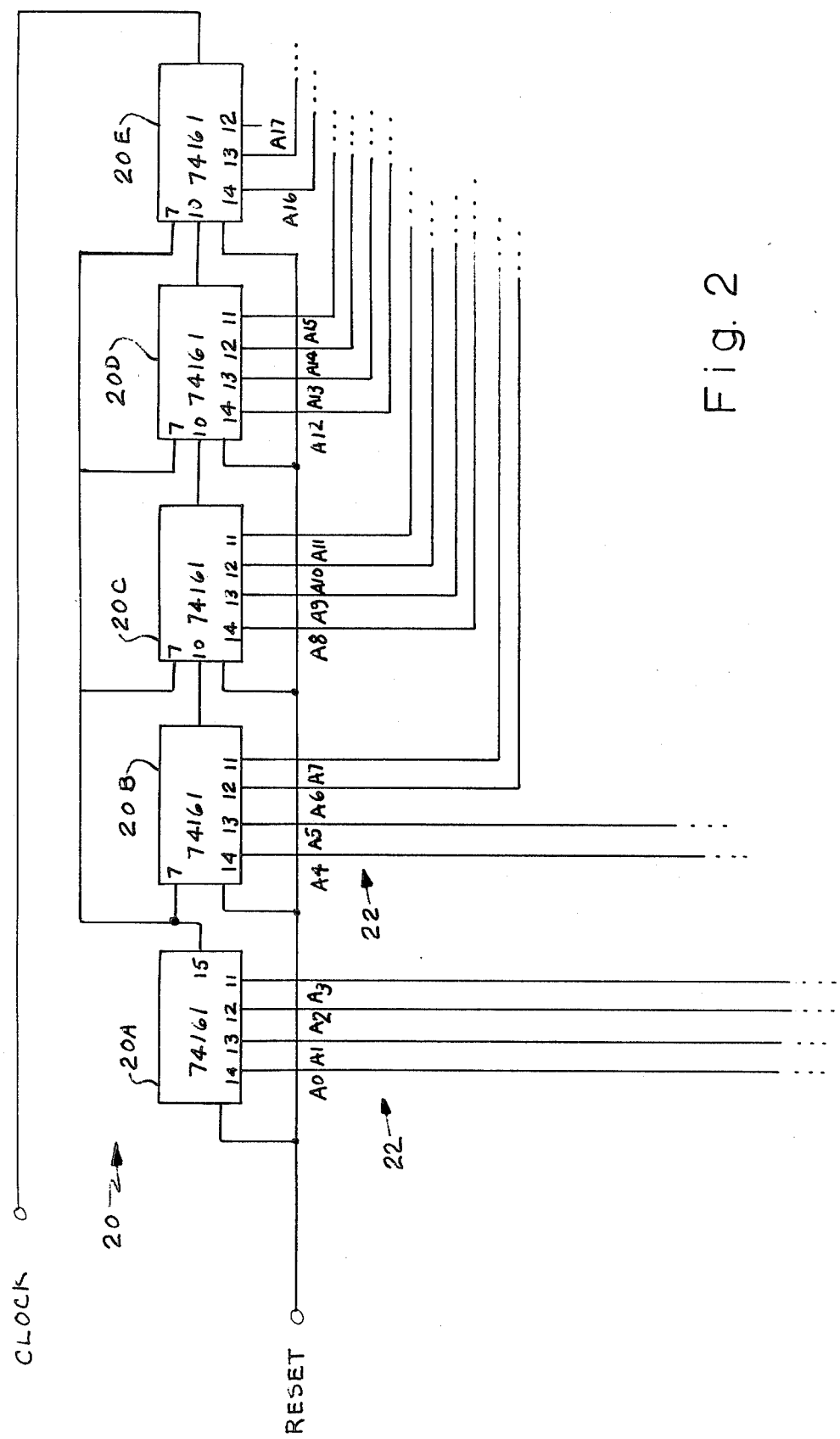
FIGS. 2, 3, 4, and 5 together are a detailed schematic representation of the system of the invention.
Figure 3:
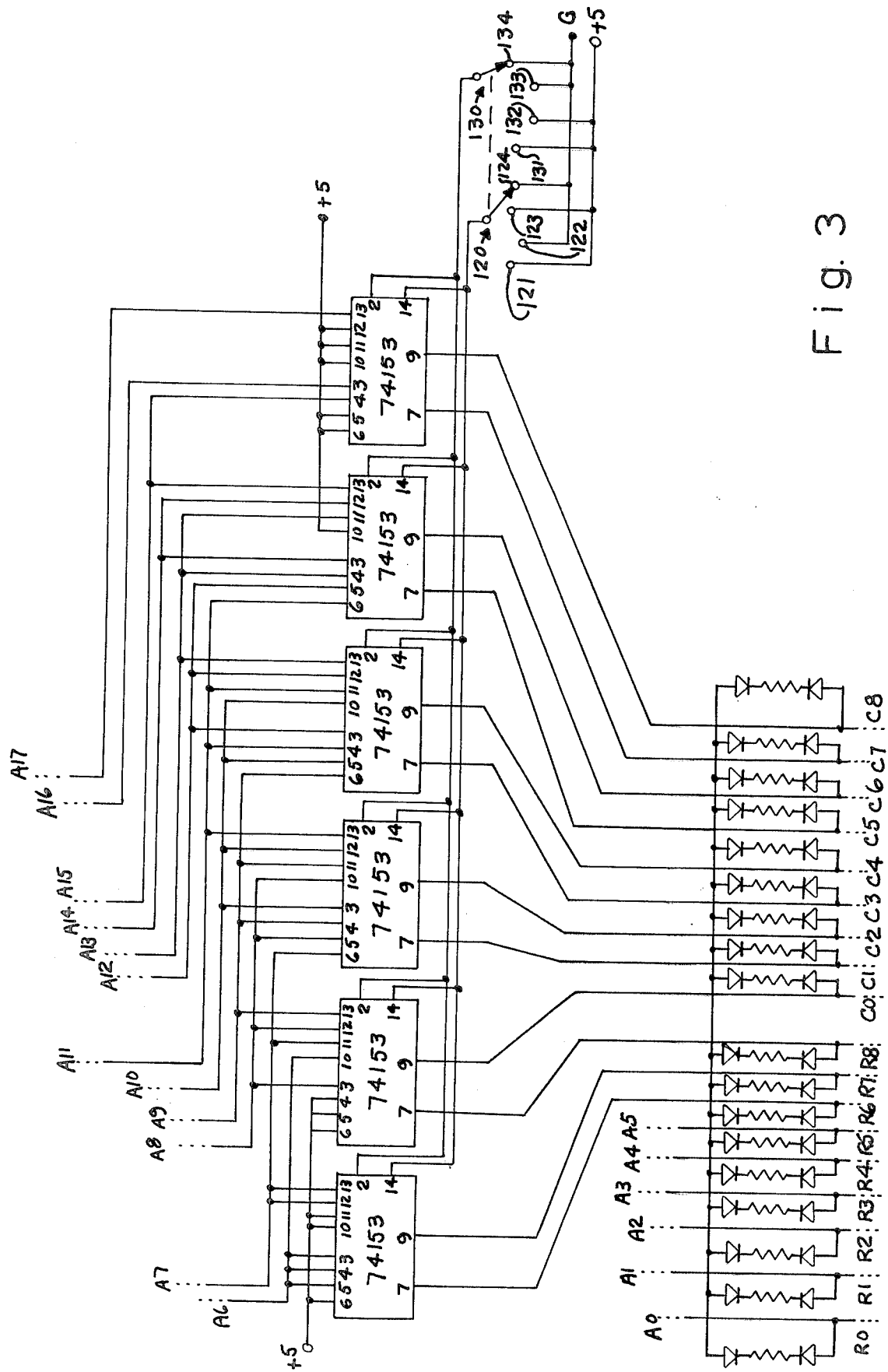
Figure 4:
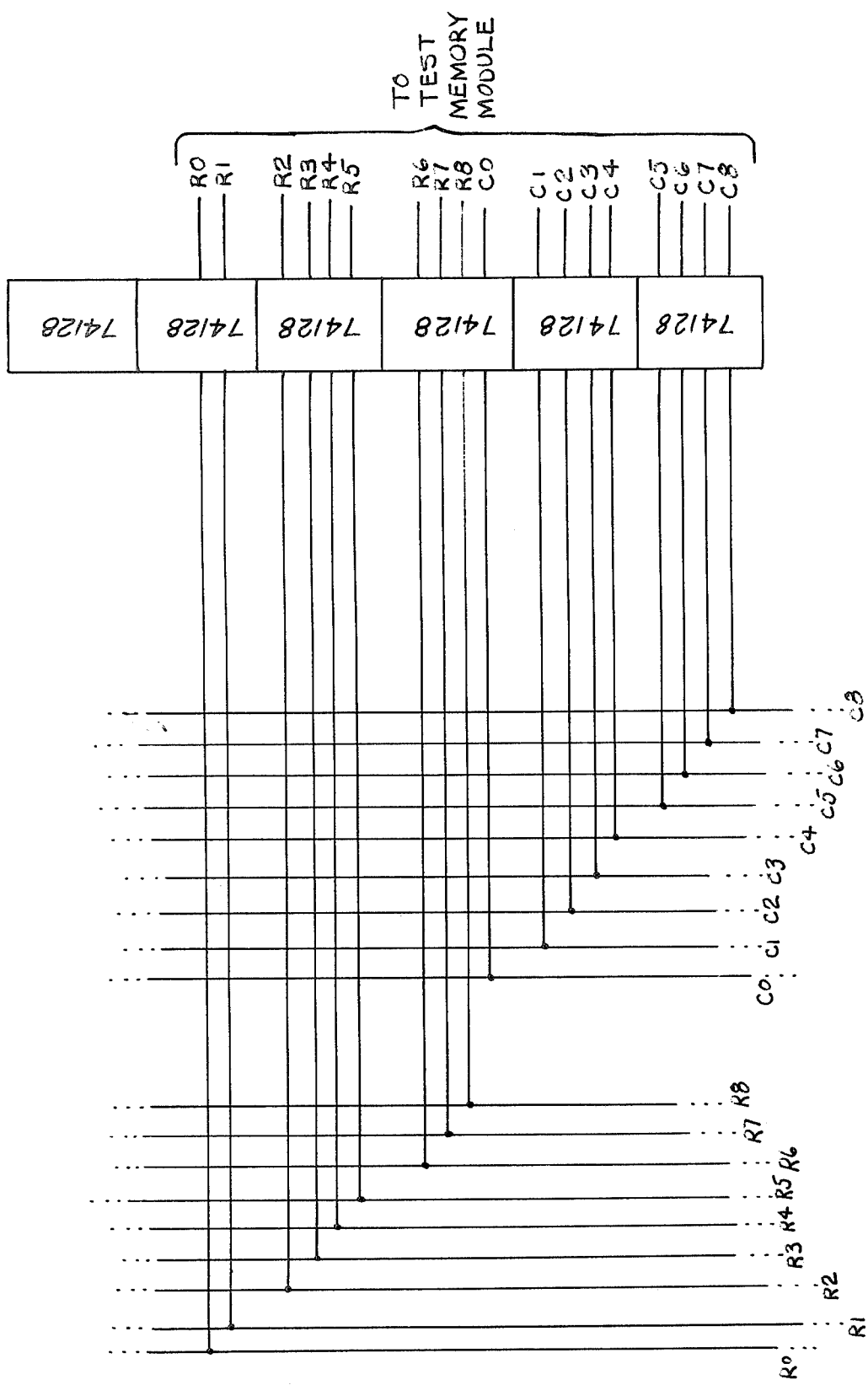
Figure 5:
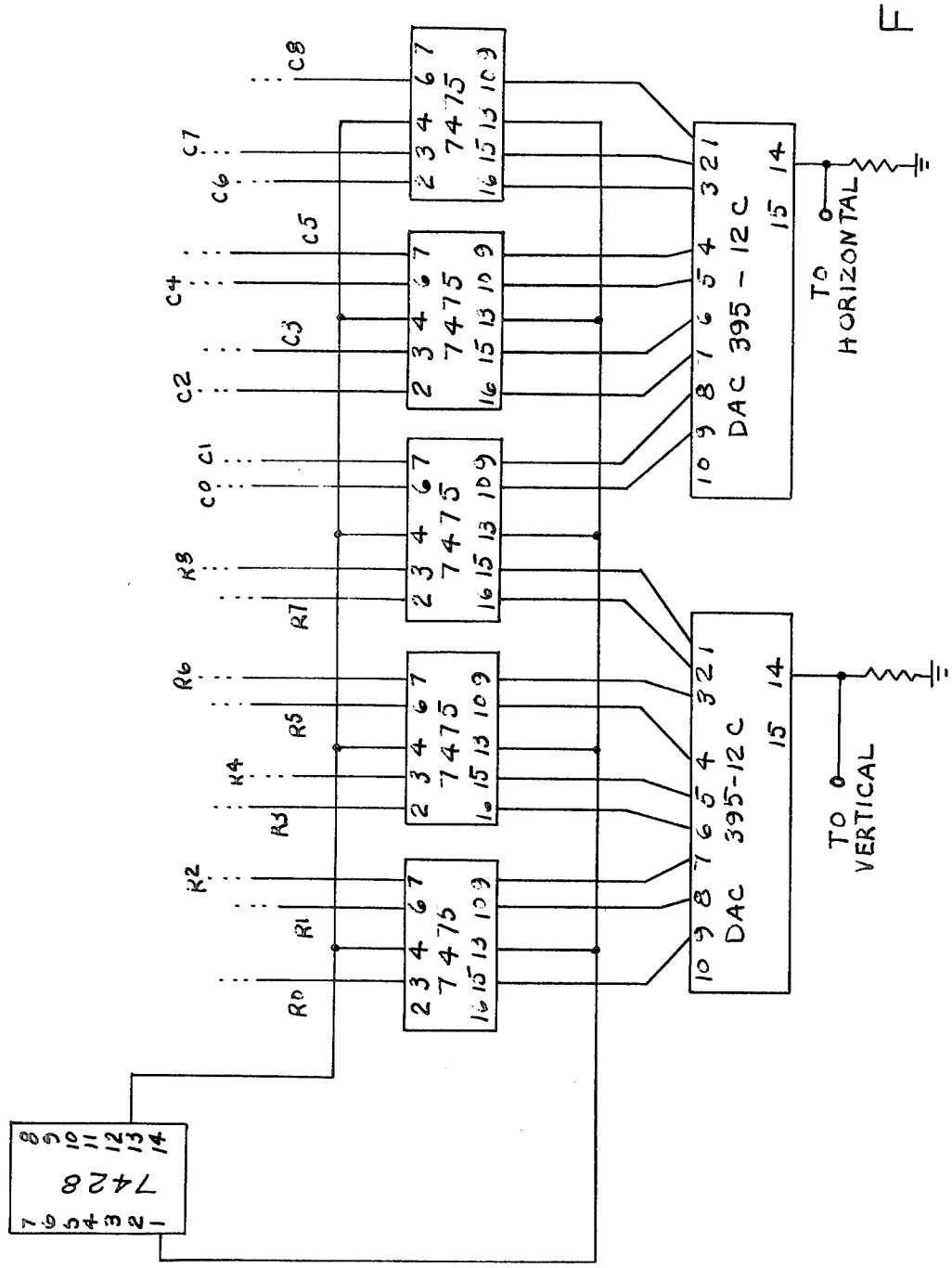

The system of the invention 10 shown in FIGS. 1 and 2 can be used to scan 4K, 16K, 64K or 256K matrices, and the signals which are produced can be used, for example, to scan and test memories of these different sizes. However, it will be clear to those skilled in the art that the principles of the invention could be applied to other memories or other semiconductor devices or for other uses altogether.

In addition, those skilled in the art will see that the invention provides relatively simple means for rearranging logic signals on a plurality of signal lines coming out of a counter circuit.

Referring to the block diagram of FIG. 1, briefly, the system of the invention 10 includes an address generator or counter 20 having a plurality of output lines 22 and a clock 30 coupled through a control circuit 40 to the input of the generator 20 to operate the generator and provide a sequence of logic signals on the output lines 22. The output lines 22 are coupled through a display memory or buffer 50 to horizontal and vertical digital-to-analog converters 60 and 70 and then to an oscilloscope 80. One group of output lines 22 is coupled directly to the display memory 50, and the remainder are coupled through a multiplexer 90 to the display memory 50. A logic control circuit 100 is coupled to multiplexer 90 and is used to set the multiplexer so that the signals at the display memory 50 can scan either a 4K, 16K, 64K or 256K matrix on the oscilloscope.

The output lines 22 from the address generator or counter 20 and multiplexer 90 can also be coupled through various circuit modules, including an address multiplexer 102 and drivers 104, to a test head 110 which carries a memory module, of any of the sizes noted above, for scanning the memory and testing its memory positions.

Portions of the system of the invention are shown in greater detail in FIG. 2, wherein the address generator 20 comprises a synchronous binary counter, including five four-bit 74,161 modules 20 (A, B, C, D, E), which provide more than 200,000 unique binary words for addressing the display memory 50. Memory 50 comprises five 7475 modules. In practicing the invention, output lines 22 numbered in order A0 through A17 are taken from counter 20, and output lines A0 through A5 are coupled directly to display memory 50, and the other output lines A6 through A17 are coupled to the multiplexer 90 which comprises six 74,153 modules. Two output lines 120 extend from each multiplexer module 50.

Figure 6:
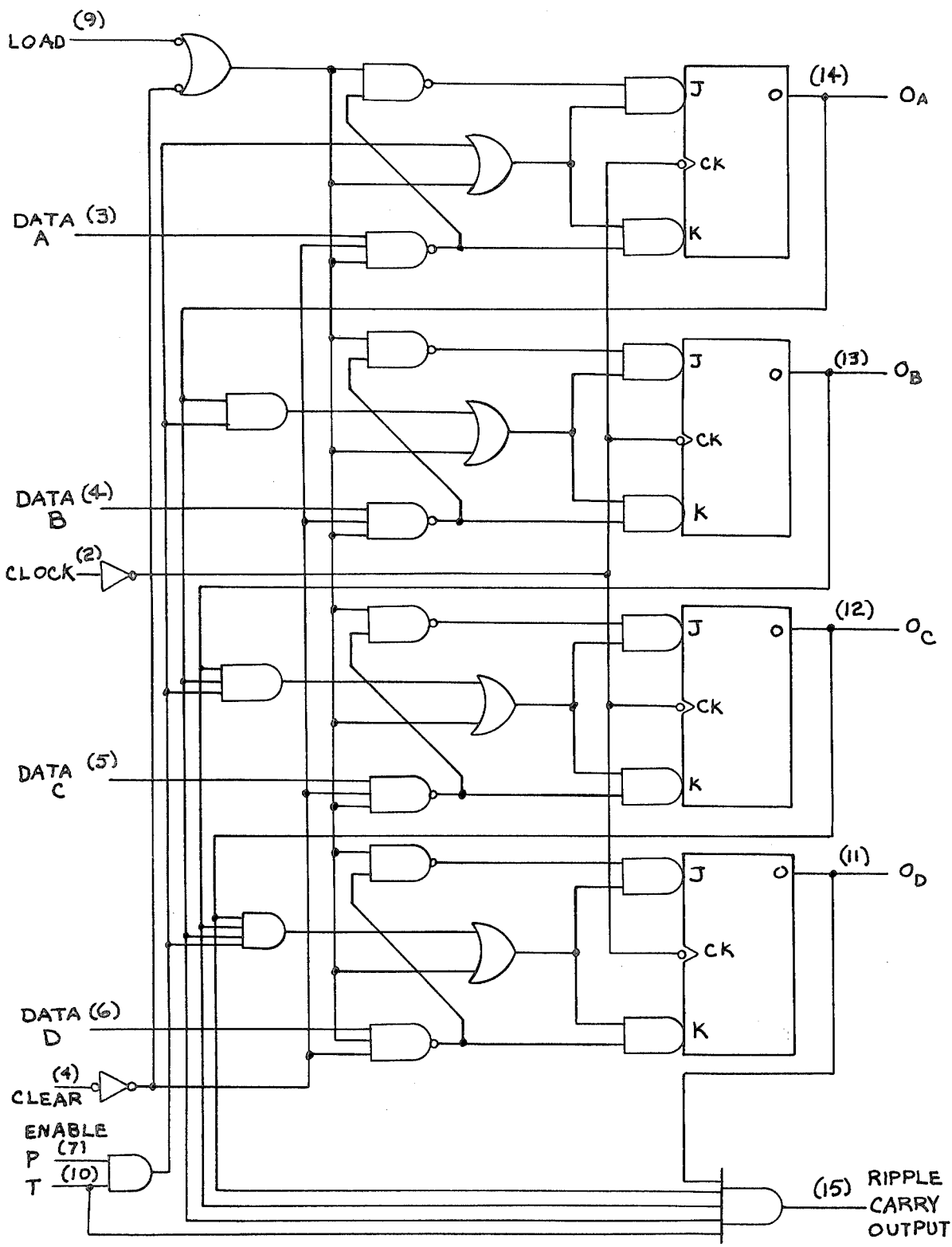
FIG. 6 is a representation of a type 74,161 module.
Figure 7:
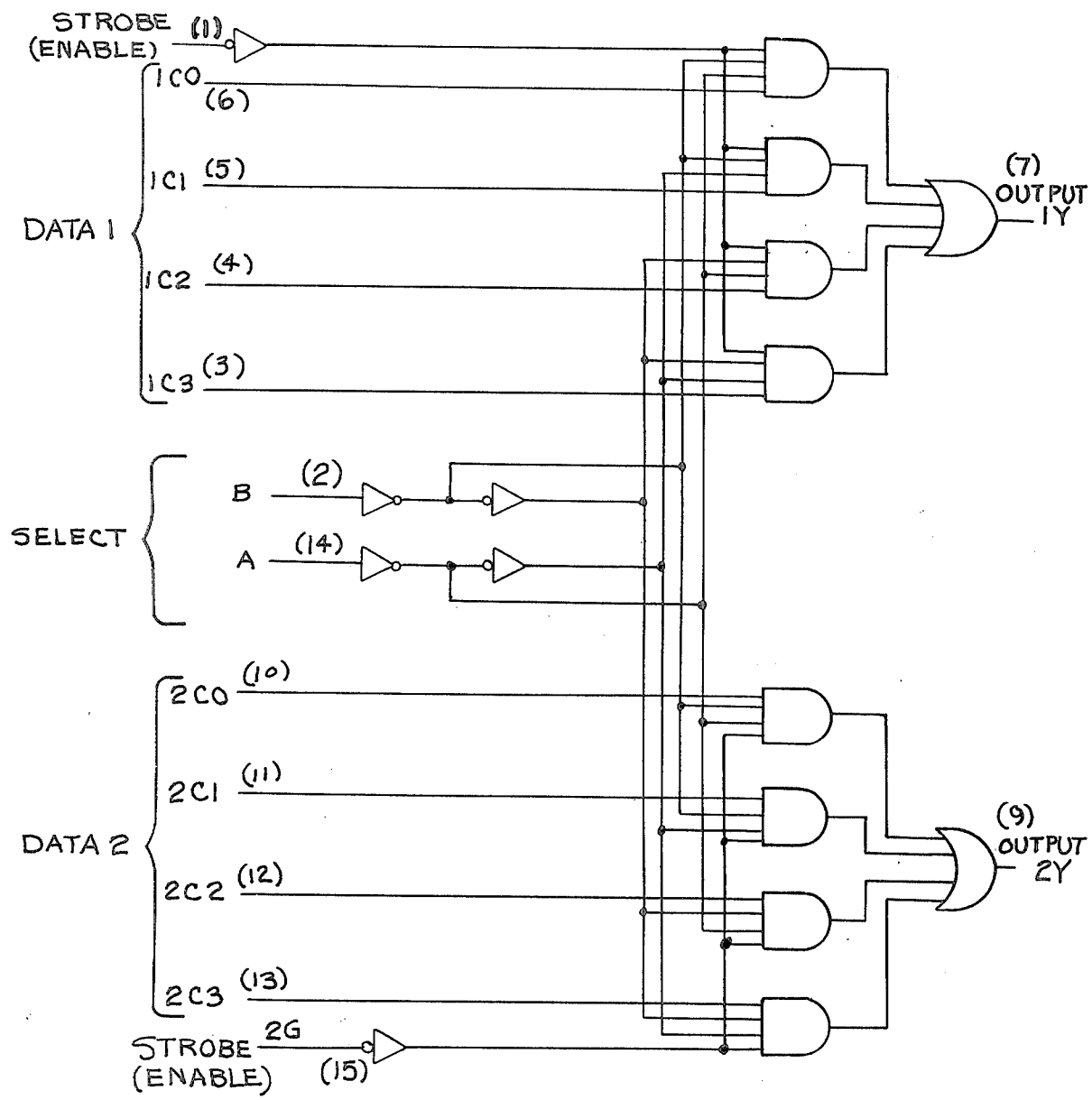
FIG. 7 is a representation of a type 74,153 module.
Figure 8:
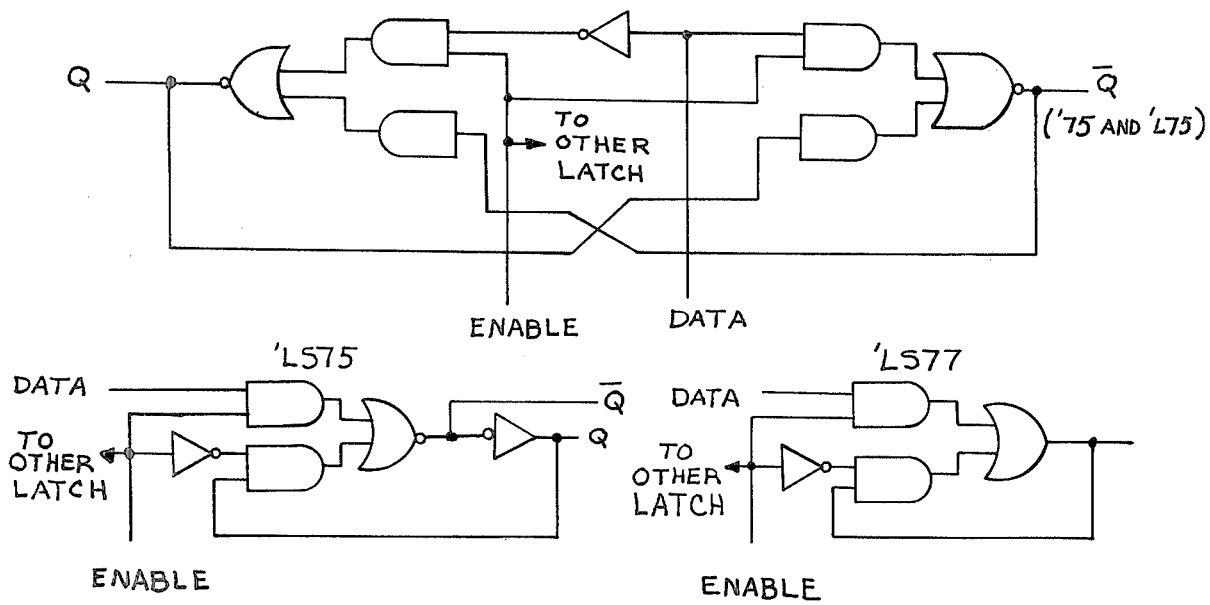
FIG. 8 is a representation of a type 7,475 module.
Figure 9:
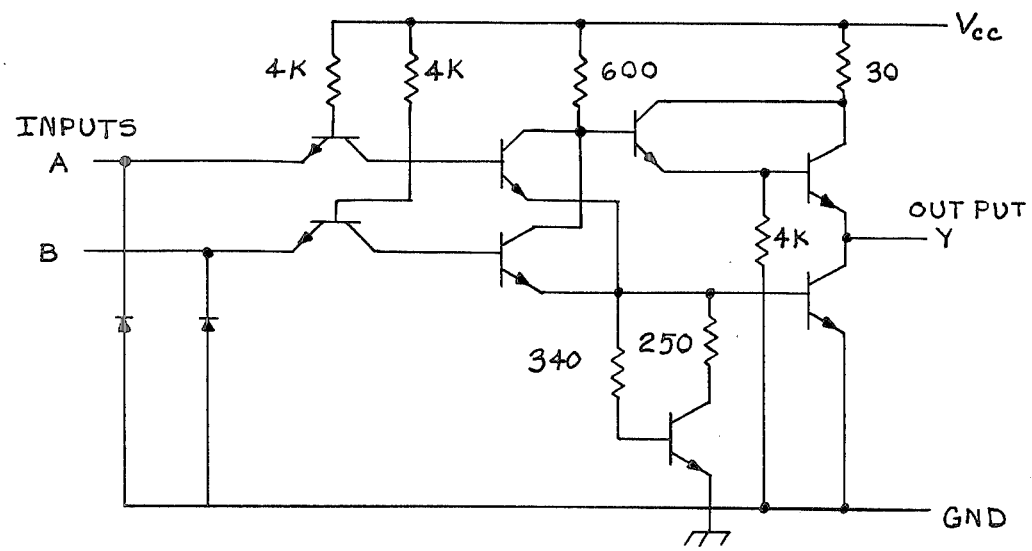
FIG. 9 is a schematic representation of a line driver used in the system of the invention.

A 74,161 module is shown in FIG. 6, a 74,153 module is shown in FIG. 7, a 7,475 module is shown in FIG. 8, and a 74,128 module is shown in FIG. 9.

For convenience of description, the counter output lines A0 through A5 are numbered R0 through R5 at the input to the memory 50, and they are connected, respectively, to terminals 3, 6, and 7 of module 50A and to terminals 2, 3, and 6 of module 50B. The output lines of the multiplexer become lines R6 through R8 and C0 through C8 at the memory, and they are connected to the terminals of the memory as shown. The R lines control rows, and the C lines control columns.

Figure 10:
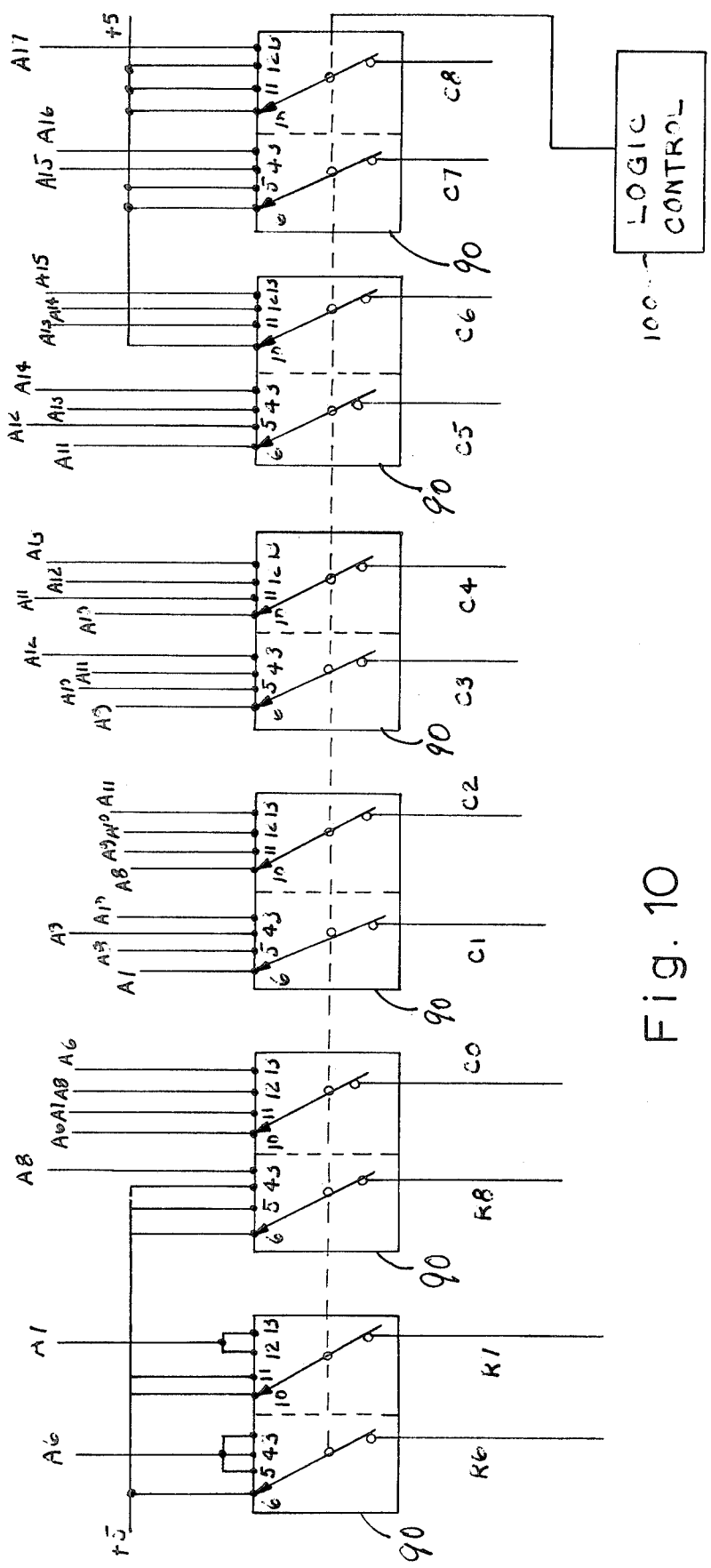
FIG. 10 is a more detailed representation of a portion of the system of FIGS. 2 through 5.

The multiplexer modules 90 are each represented as two four-position switches which are switched by the control logic module 100 to provide the desired logic at the memory 50. The internal connections of the multiplexer modules to the input and output lines A, R, and C are illustrated schematically in FIG. 10.

The control logic module 100 includes a first four-position switch 120 having contacts 121, 122, 123, 124 and a contact arm 125, and a second four-position switch 130 having contacts 131, 132, 133, 134 and a contact arm 135. A ground or logic zero bus 140 is connected to contacts 122, 124, 133 and 134, and a +5 volt or logic one bus 150 is connected to terminals 121, 123, 131 and 132. The contact arms 125 and 135 are ganged; contact arm 125 is connected to pin 14 of each of the multiplexer modules, and contact arm 135 is connected to pin 2 of each of the multiplexer modules. The contact arms 125 and 135 are positioned in contact, respectively, with contacts 124 and 134, 123 and 133, 122 and 132, and 121 and 131 for 4K, 16K, 64K and 256K scans.

Figure 11:
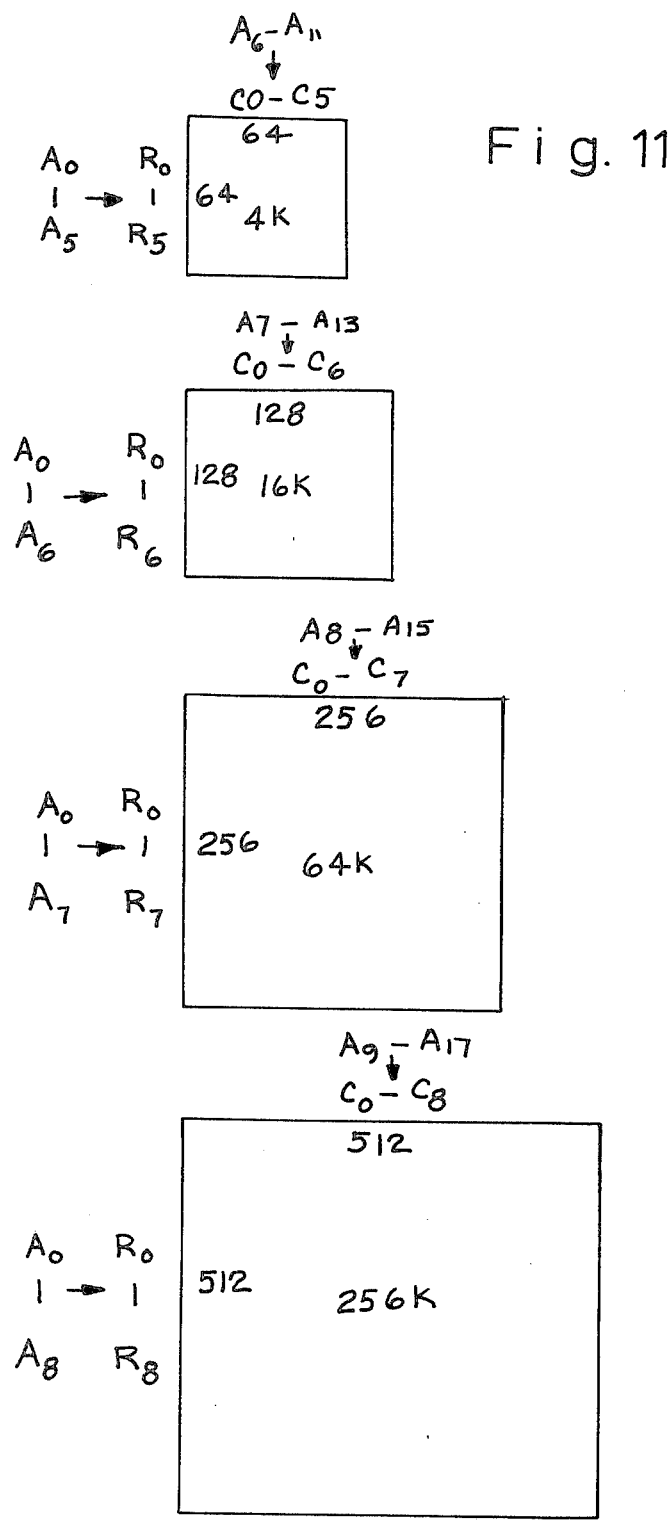
FIG. 11 is a representation of the different matrices with which the invention may be practiced.

The principles of the invention are illustrated in FIG. 11 wherein the four matrices, which can be scanned, are represented. To scan a 4K matrix, signal lines R0 through R5 control the rows energized, and lines C0 through C5 control the columns which are energized. To scan a 16K matrix, the system utilizes lines R0 through R6 for rows and lines C0 through C6 for columns. To scan a 64K matrix, the system uses lines R0 through R7 for rows and lines C0 through C7 for columns, and to scan a 256K matrix, the system uses lines R0 through R8 for rows and lines C0 through C8 for columns. It can be seen that lines A0 through A5 are used in all of the matrices, and, for this reason, these lines are connected directly to the memory 50. The provision of the signals which cause the various matrices to be scanned is determined by the setting of the multiplexer 90, and the multiplexer is set by the logic control circuit 100.

More specifically, to scan a 4K matrix, logic one or +5 volts is connected to lines A6, A7 and A8 and lines A12, A13 and A14. This, in effect, biases these lines out of the scanning cycle to be described. To scan a 16K matrix, lines A6 and A12 are released to the scanning cycle and logic one or +5 volts is connected to lines A7, A8 and lines A13, A14; for a 64K matrix, logic one or +5 is connected to lines A8 and A14; and for a 256K matrix, all of the lines are in the scan sequence and none is biased out. In the last case, lines A0 to A8 control the rows which are energized, and lines A6 to A11 control the columns which are energized.

At the start of the 4K cycle of operation, referring to FIG. 12, with the logic module switches set to the 4K position, all of the logic levels on the lines R0 to R5 and C0 to C5 at the memory are zeros, and these logic levels are coupled through the memory and converters 60 and 70 to the cathode ray rube (CRT) and the electron beam is positioned at the first position in the first row and first column of the 4K raster. The first clock signal changes the R0 line to a logic one level, the only change in logic which occurs, and this operates through the converters to position the beam at the second row location in the first column on the CRT or, in other words, the first position in the second row. The successive clock signals, which total sixty-four, move the beam to sixty-four successive locations or rows in the first column in the CRT.

The next clock pulse, after the sixty-fourth, due to the arrangement of the multiplexer 90, provides logic zero levels on lines R0 through R5, logic one levels on lines R6, R7, and R8, a logic one level on line C0, logic zero levels on lines C1 through C5, and logic one levels on lines C6, C7, and C8. This combination of signals acting through the converters causes the beam, on this next pulse, to move to the first position or row in the second column on the CRT. The successive clock signals which total sixty-four again cause the beam to move from position to position in the second column until sixty-four positions have been reached.

The next clock signal, after the second sixty-fourth, provides logic signals similar to that for positioning the beam at the first row and second column except that now line C1 carries a logic one, and this, acting through the converters, causes the beam to move to the first row or position in column 3. Successive clock signals now move the beam to sixty-four successive locations in the third column, and this operation is repeated until the beam scans all of the rows in the sixty-fourth column. The scan is then repeated.

In order to scan a 16K matrix, the contact arms 125 and 135 of logic control module 100 are moved to contacts 123 and 133. At the beginning of a cycle, this provides logic levels shown in FIG. 12, with lines R0 through R6 carrying logic zero, lines R7 and R8 carrying logic ones, lines C0 through C6 carrying logic zero, and lines C7 and C8 carrying logic ones. As clock signals are applied, the 16K matrix is scanned generally as described above. To scan a 64K matrix, the contact arms 125 and 135 in the module 100 are moved to contacts 122 and 132, and this places lines R7 and C7 in the scan cycle and applies logic zero to these lines at the beginning of the scan cycle. 64K and 256K scans are effected similarly by operating module 100 to bring lines R7, R8 and C7 and C8 into the scanning cycle.

As noted above, the scanning signals generated can be used to scan memories of the various sizes indicated to determine the state of each memory position. Other uses of the invention will occur to those skilled in the art.

What is claimed is:

1. Signal processing apparatus comprising
   a counter having a plurality of output lines which can carry logic signals,
   a clock coupled to said counter for causing said counter to count and generate a sequence of logic signals on said output lines,
   display means including means for generating a raster scan therein,
   digital to analog converter means for generating control signals for generating said raster scan and coupled to said display means,
   a plurality of said lines coupled directly to said converter means, and
   a control circuit coupled between the others of said lines and said converter means, said control circuit being operable to modify the logic signals provided at said converter means for generating raster scan matrices of different capacities.

2. Signal processing apparatus comprising
   a counter having a plurality of output lines which can carry logic signals,
   a clock coupled to said counter for causing said counter to count and generate a sequence of logic signals on said output lines,
   display means including horizontal and vertical control means for generating a raster scan therein,
   digital to analog converter means coupled to said horizontal and vertical control means for generating control signals for generating said raster scan,
   a plurality of said lines coupled directly to said converter means, and
   a control circuit coupled between the others of said lines and said converter means, said control circuit being operable to modify the logic signals provided at said converter means for generating raster scan matrices of different capacities.

3. The apparatus of claim 2 wherein said control circuit comprises a multiplexer circuit including means for modifying selectively the logic signals on the others of said lines which are coupled thereby to said converter means.

4. Signal processing apparatus comprising
   a counter having a plurality of output lines which can carry logic signals,
   a clock coupled to said counter for causing said counter to count and generate a sequence of logic signals on said output lines,
   display means including horizontal and vertical control means for generating a raster scan therein,
   digital to analog converter means coupled to said horizontal and vertical control means,
   a plurality of said lines coupled, without modification, directly to said digital to analog converter means, and
   a multiplexer and logic control means therefor coupled between the others of said lines and said digital to analog converter means, said multiplexer being settable by said logic control means to modify the logic signals provided at said digital to analog converter means whereby said display means can scan rasters of different sizes.

5. Signal processing apparatus comprising a counter having a plurality of output lines which can carry logic signals, a clock coupled to said counter for causing said counter to count and generate a sequence of logic signals on said output lines, a cathode ray tube having horizontal and vertical beam control apparatus, a first digital to analog converter for generating vertical control signals for said cathode ray tube and a second digital to analog converter for generating horizontal control signals for said cathode ray tube, a plurality of said lines coupled, without logic modification, directly to said converters, and a multiplexer and logic control means therefor coupled between the others of said lines and said digital to analog converters, said multiplexer being settable by said logic control means to modify the logic signals provided at said digital to analog converters whereby said display means can scan rasters of different sizes.

6. Signal processing apparatus comprising a counter having a plurality of output lines which can carry logic signals, a clock coupled to said counter for causing said counter to count and generate a sequence of logic signals on said output lines, display means including horizontal and vertical control means for generating a raster scan therein, digital to analog converter means coupled to said horizontal and vertical control means, a plurality of said lines coupled, without modification, directly to said digital to analog converter means, a multiplexer having an input and an output, the others of said lines being coupled to the input of said multiplexer, the output of said multiplexer having a plurality of lines coupled to said digital to analog converter along with said plurality of said lines from said counter, and logic control means coupled to said multiplexer, said multiplexer being settable by said logic control means to modify the logic signals provided at said digital to analog converter means to cause said display means to scan rasters of different sizes.

7. The apparatus defined in claim 6 wherein said plurality of said lines from said counter and the output lines from said multiplexer are coupled also to a memory module whose positions can be scanned as the matrix is scanned in said display means.

* * * * *